United States Patent [19]

Naghshineh

[11] Patent Number: 5,121,000

[45] Date of Patent: Jun. 9, 1992

[54] EDGE-RATE FEEDBACK CMOS OUTPUT BUFFER CIRCUITS

[75] Inventor: Kianoosh Naghshineh, Menlo Park, Calif.

[73] Assignee: Advanced Micro Devices, Inc., Sunnyvale, Calif.

[21] Appl. No.: 666,165

[22] Filed: Mar. 7, 1991

[51] Int. Cl.$^5$ .................................... H03K 17/16
[52] U.S. Cl. .................................. 307/443; 307/246; 307/263; 307/572
[58] Field of Search ............... 307/443, 475, 481, 246, 307/263, 571, 572

[56] References Cited

U.S. PATENT DOCUMENTS

| | | | |
|---|---|---|---|
| 4,906,867 | 3/1990 | Petty | 307/443 |
| 4,961,010 | 10/1990 | Davis | 307/542 X |
| 5,028,818 | 7/1991 | GoAng et al. | 307/246 X |

Primary Examiner—David Mis
Attorney, Agent, or Firm—Davis Chin

[57] ABSTRACT

A CMOS output buffer circuit for providing an output signal at an output terminal which has a significant reduction in ground bounce over processing and power supply variations includes an output driver stage (12), a pull-up pre-driver circuit (14), a pull-down pre-diver circuit (16), and feedback means. The output driver stage is formed of a pull-up transistor (P1) and a pull-down transistor (N1). The feedback means is responsive to the output signal for controlling the rate of rise of the voltage at the gate electrode of the pull-down transistor so as to slow down its turn-on time when the output terminal is making a high-to-low transition, thereby significantly reducing the ground bounce. The feedback means is preferably formed of a capacitor (C2) having a first plate connected to the output terminal and a second plate coupled to the gate electrode of the pull-down transistor.

7 Claims, 4 Drawing Sheets

EDGE-RATE FEEDBACK CMOS OUTPUT BUFFER CIRCUITS

BACKGROUND OF THE INVENTION

This invention relates generally to semiconductor integrated circuits and more particularly, it relates to CMOS output buffer circuits which have a reduction in ground bounce over processing and power supply variations.

As is well-known in the art, output buffers are commonly used with a variety of electronic and computer-type circuits. For example, CMOS output buffers are used to provide desired drive characteristics for logical functions on semiconductor chips. In VLSI systems, there will be many output buffers whose outputs could be switching simultaneously. Thus, it is desired that each output buffer produce a minimal amount of noise so as to avoid degrading the output levels (logic "1" and logic "0") which might cause interface problems among the output buffers and the other integrated logic circuits.

Traditionally, such output buffers have been designed for specific circuits to provide specified operating speeds, voltage and current driving characteristics under fast process corners and high power supply voltages for the purpose of reducing ground bounce. However, the designed drive characteristics of these output buffers may produce unacceptable performance degradation at slow process corners and low power supply voltages. Ideally, the output buffers should have minimal variations in noise and speed over the changes of process corner and power supply voltages.

Output buffer circuits typically use a pull-up transistor device and a pull-down transistor device connected in series between first and second external power supply terminal pins. The first power supply terminal pin may be supplied with a positive potential or voltage VCC, which is connected to an internal power supply potential node via a first connection lead having associated package inductance. The second power supply terminal pin may be supplied with a ground potential VSS which is connected to an internal ground potential node via a second connection lead having associated package inductance. The common connection point of pull-up and pull-down transistor devices defines an internal output node which is further joined to an external output terminal pin via a third connection lead having associated package inductance. The external output terminal pin is used for driving other circuitry on other integrated circuits which may have widely varying capacitive loading effects.

Dependent upon the logic state of the data input signal and an enable signal being in the active state, either the pull-up or pull-down transistor device is quickly turned OFF and the other one of them is turned ON. Such rapid switching OFF and ON of the pull-up and pull-down devices causes sudden surges of current creating what is commonly known as current spikes. As a result, when the internal output node is making a high-to-low transition, oscillation or inductive ringing will appear at the output terminal pin referred to as "ground bounce." This "ground bounce" is defined to be the undershooting of the ground potential followed by a dampening oscillation around it. This is a major problem encountered in designing high speed, output buffer circuits.

Also, during such output switching, charging and discharging currents from the pull-up and pull-down transistor devices will flow through the package inductances of the power supply and ground lines so as to cause inductive noises at the internal power supply potential node and at the internal ground potential node. While it is desired to have large pull-up and pull-down devices for charging or discharging the capacitive loads at high speeds, which is advantageous, this will also cause increased noises on the internal supply and ground lines that are undesirable since they will degrade the output levels.

It would therefore be desirable to provide a CMOS output buffer circuit which produces a minimal amount of noise on the internal supply and ground lines without sacrificing the high speed of operation. Further, it would be expedient to have the output buffer circuit exhibit a constant behavior independently of variations in process corner and power supply voltages.

There have been attempts in the prior art of output buffer design to minimize the ground bounce and the supply and ground noises without sacrificing the needed high-speed of operation. In FIG. 1, there is shown a schematic circuit diagram of a prior art output buffer circuit which includes a staged pull-up means formed of a first plurality of N-channel transistors $2a$, $2b$ and $2c$ and a staged pull-down means formed of a second plurality of N-channel transistors $3a$, $3b$ and $3c$. The input signal is fed to two NAND logic gates $4a$, $4b$ whose outputs provide control signals via inverters for driving the pull-up and pull-down means, respectively. Since there is no effective control of the gate-to-source voltage $V_{GS}$, there exists the possibility that one of the transistors in either the pull-up or pull-down means will still be turned on when one of the transistors in the pull-down or pull-up means is being turned on, resulting in a cross-over current due to their simultaneous conduction.

In FIG. 2, there is shown a schematic circuit diagram of another of the prior art output buffer circuits which also includes a staged pull-up means formed of two N-channel transistors $5a$, $5b$ connected in parallel and a staged pull-down means formed of two N-channel transistors $6a$, $6b$ connected in parallel. There are provided NAND logic gates $7a$–$7d$ and NOR logic gates $8a$, $8b$ which are used to turn OFF and ON the transistors in the pull-up and pull-down means in a correct sequence. However, since there is likewise no control of the voltage $V_{GS}$, this prior art circuit does not always perform the proper switching sequence of the transistors as it was designed to do.

The present invention controls the rate of change of the gate-to-source voltage applied to the gate of the pull-down transistor in the output stage when it is to be turned on so as to significantly reduce or suppress the ground bounce. This is achieved through the provision of edge-rate feedback means coupled between the internal output node of the output stage and the gate of the pull-down transistor.

SUMMARY OF THE INVENTION

Accordingly, it is a general object of the present invention to provide an edge-rate feedback CMOS output buffer circuit with a significant reduction in ground bounce which is relatively simple and economical to manufacture and assemble, but yet overcomes the disadvantages of the prior art buffer circuits.

It is an object of the present invention to provide an improved edge-rate feedback CMOS output buffer circuit which has a significant reduction in inductive ringing.

It is another object of the present invention to provide a CMOS output buffer circuit which includes feedback means for controlling the rate of rise of the voltage at the gate electrode of the pull-down transistor in the output stage so as to slow down its turn-on time.

It is still another object of the present invention to provide a CMOS output buffer circuit which is formed of an output driver stage, a pull-up pre-driver circuit, a pull-down pre-driver circuit, and feedback means controlling the rate of rise of the gate-to-source voltages, thereby reducing significantly the ground bounce.

In accordance with these aims and objectives, the present invention is concerned with the provision of a CMOS output buffer circuit for providing an output signal at an output terminal which has a significant reduction in ground bounce over processing and power supply variations. The CMOS output buffer circuit includes an output driver stage, a pull-up pre-driver circuit, a pull-down pre-driver circuit, and a feedback means. The output driver stage is formed of a pull-up transistor and a pull-down transistor. The pull-up transistor is responsive to a first control signal for generating a transition from a low logic level to a high logic level at the output terminal. The pull-down transistor is responsive to a second control signal for generating a transition from the high logic level to the low logic level at the output terminal. The pull-up pre-driver circuit is responsive to a data input signal and an enable signal for generating the first control signal. The pull-down pre-driver circuit is responsive to the data input signal and the enable signal for generating the second control signal. The feedback means is responsive to the output signal for controlling the rate of rise of the voltage at the gate electrode of the pull-down transistor so as to slow down its turn-on time when the output terminal is making the high-to-low transition, thereby significantly reducing the ground bounce.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
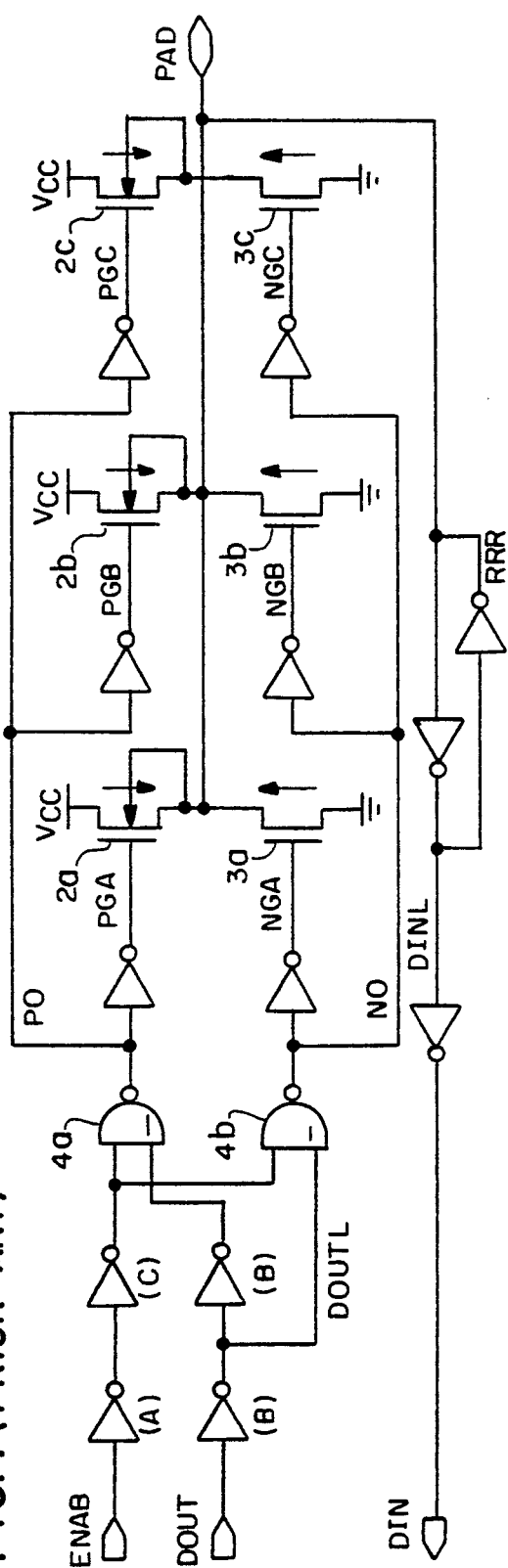
FIG. 1 is a schematic circuit diagram of a prior art output buffer circuit.
Figure 2:
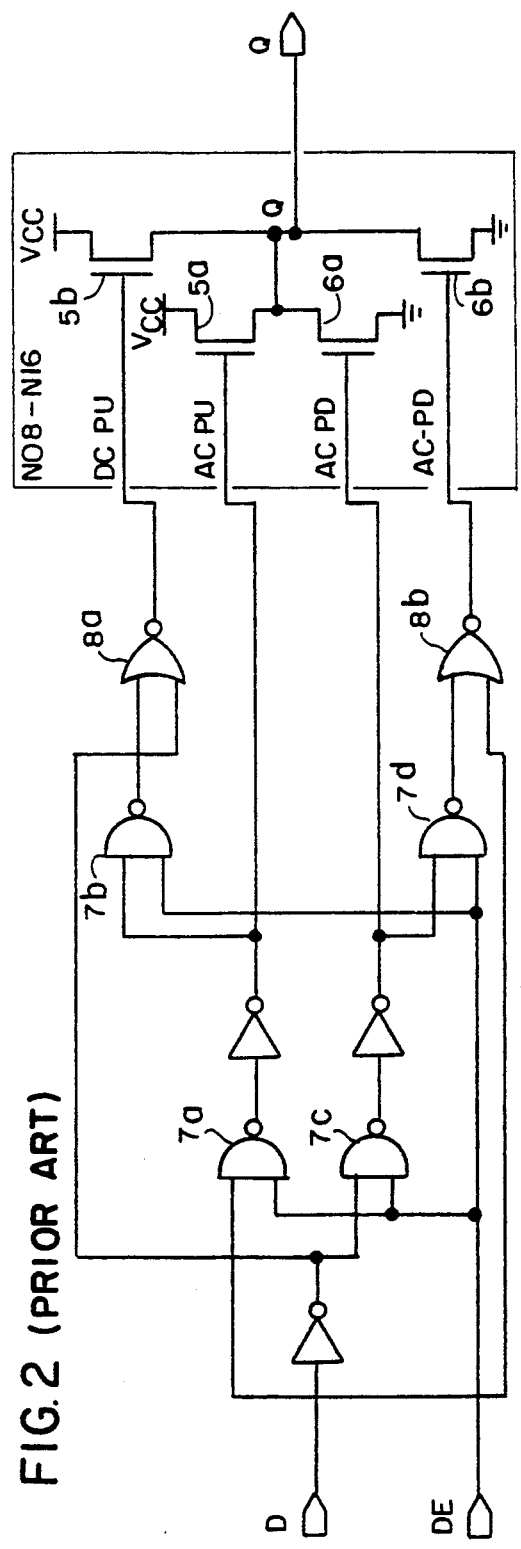
FIG. 2 is a schematic circuit diagram of another prior art buffer circuit.
Figure 3:
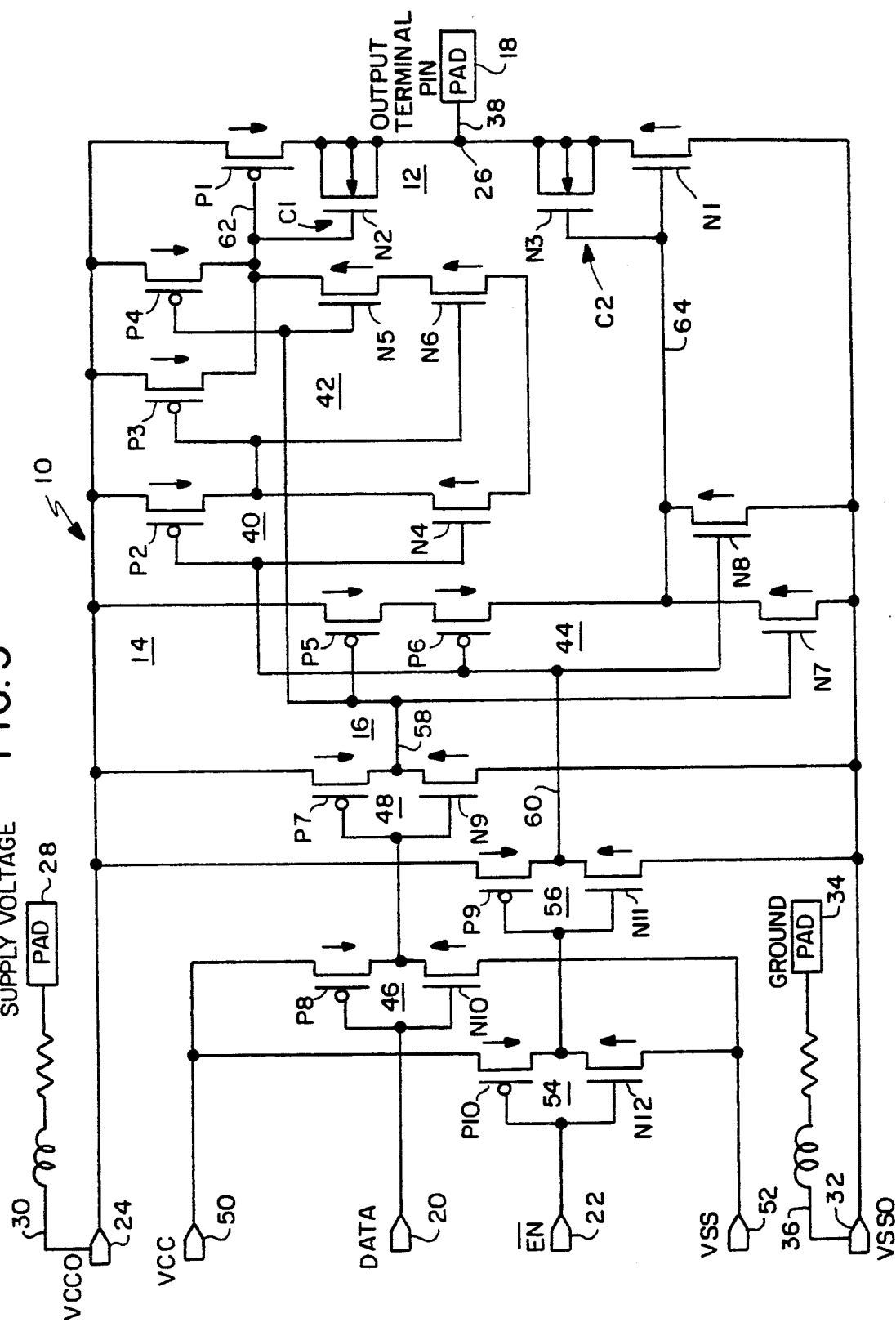
FIG. 3 is a schematic circuit diagram of an edge-rate feedback CMOS output buffer circuit, constructed in accordance with the principles of the present invention.

Referring now in detail to the drawings, there is shown in FIG. 3 a schematic circuit diagram of an edgeate feedback CMOS output buffer circuit 10 which is constructed in accordance with the principles of the present invention. The buffer circuit 10 is comprised of an output driver stage 12, a pull-up pre-driver circuit 14, and a pull-down pre-driver circuit 16. The buffer circuit 10 provides an output signal at an output terminal pin (pad) 18 in response to a data input signal DATA received at a data input node 20 and an enable signal $\overline{EN}$ received at an enable input node 22. The output buffer circuit provides the capability of driving quickly capacitive loads (not shown) connected to the output terminal pin or pad 18, but yet reduces significantly or suppresses the ground bounce (inductive ringing) when the input signal is making a high-to-low transition. For this transition of the input signal, the output terminal pin 18 is also pulled down to a low voltage level.

The output driver stage 12 includes a P-channel MOS pull-up transistor P1 and an N-channel MOS pull-down transistor N1. The transistor P1 is connected between a first internal power supply potential node 24 (VCCO) and an internal output node 26. The first internal power supply potential node 24 is further connected to a supply voltage pad 28 via lead connection 30 having associated resistive and inductive components. The supply voltage pad 28 is typically connected to +5.0 volts. The transistor N1 is connected between a second internal power supply potential or ground node 32 (VSSO) and the internal output node 26. The ground potential node 32 is further connected to a ground pad 34 via a lead connection 36 having associated resistive and inductive components. The ground pad 34 is typically connected to zero volts. The internal output node 26 is further connected to the output terminal pin 18 via a lead connection 38 having associated package inductance (not shown).

The pull-up pre-driver circuit 14 includes an inverter 40 and a two-input NAND logic gate 42. The inverter 40 is formed of a P-channel MOS transistor P2 and an N-channel MOS transistor N4. The transistor P2 has its source connected to the power supply potential node 24, its gate connected to the gate of the transistor N4, and its drain connected to the drain of the transistor N4. The source of the transistor N4 is connected to the ground potential node 32. The common gates of the transistors P2 and N4 define the input of the inverter 40, and the common drains of the transistors P2 and N4 define the output of the inverter 40. The NAND logic gate 42 includes P-channel MOS transistors P3, P4 and N-channel MOS transistors N5, N6. The transistor P3 has its source connected to the source of the transistor P4 and to the power supply potential node 24 and has its drain connected to the drain of the transistor P4. The transistor N5 has its drain connected to the drain of the transistor P4 defining the output of the NAND gate 42 and has its source connected to the drain of the transistor N6. The output of the NAND gate 42 provides a first control signal which is fed to the gate of the pull-up transistor P1. The source of the transistor N6 is also connected to the power supply potential node 32. The gates of the transistors P3 and N6 are connected together defining a first input of the NAND gate 42 and are further joined to the output of the inverter 40. The gates of the transistors P4 and N5 are connected together defining a second input of the NAND gate 42.

The pull-down pre-driver circuit 16 includes a NOR logic gate 44. The logic gate 44 is formed of P-channel MOS transistors P5, P6 and N-channel MOS transistors N7, N8. The transistor P5 has its source connected to the power supply potential node 24 and its drain connected to the source of the transistor P6. The gate of the transistor P5 is connected to the gate of the transistor N7 and defines a first input of the NOR gate 44. The gate of the transistor P6 is connected to the gate of the transistor N8 and defines a second input of the NOR gate 44. The transistor P6 has its drain connected to the common drains of the transistors N7, N8 defining the output of the NOR gate 44. The source of the transistor N7 is connected to the source of the transistor N8 and to the ground potential node 32. The output of the NOR gate 44 provides a second control signal which is fed to the gate of the pull-down transistor N1.

The output buffer circuit 10 further includes data input buffer formed of inverters 46 and 48. The inverter 46 includes a P-channel MOS transistor P8 and an N-channel MOS transistor N10. The transistor P8 has its source connected to an internal "quiet" power supply potential node 50 (VCC), which is typically at +5.0 volts, its gate connected to the gate of the transistor N10, and its drain connected to the drain of the transistor N10. The common gates of the transistors P8 and N10 defining the input of the inverter 46 are connected to the data input node 20. The common drains of the transistors P8 and N10 define the output of the inverter 46. The source of the transistor N10 is connected to an internal "quiet" ground potential node 52 (VSS).

The inverter 48 includes a P-channel MOS transistor P7 and an N-channel MOS transistor N9. The transistor P7 has its source connected also to the power supply potential node 24, its gate connected to the gate of the transistor N9 and its drain connected to the drain of the transistor N9. The common gates of the transistors P7 and N9 define the input of the inverter 48, which is connected to the output of the inverter 46. The common drains of the transistors P7 and N9 define the output of the inverter 48, which is connected to the second input of the NAND gate 42 and to the first input of the NOR gate 44. The source of the transistor N9 is also connected to the ground potential node 52. Since the power supply and ground potential nodes 50, 52 for the inverter 46 are different from the power supply and ground potential nodes 24, 32 for the inverter 48, this isolation will prevent noise on the power supply potential and ground nodes 24, 32 caused by the transients on the output node 26 from adversely recognizing the level of the data input signals on the terminal 20

The output buffer circuit 10 also includes an enable input buffer formed of inverters 54 and 56. The inverter 54 includes a P-channel MOS transistor P10 and an N-channel MOS transistor N12. The transistor P10 has its source also connected to an internal "quiet" power supply potential node 50, its gate connected to the gate of the transistor N12, and its drain connected to the drain of the transistor N12. The common gates of the transistors P10 and N12 defining the input of the inverter 54 are connected to the enable input node 22. The common drains of the transistors P10 and N12 define the output of the inverter 54. The source of the transistor N12 is also connected to the internal "quiet" ground potential node 52.

The inverter 56 includes P-channel MOS transistor P9 and an N-channel MOS transistor N11. The transistor P9 has its source connected to the power supply potential node 24, its gate connected to the gate of transistor N11, and its drain connected to the drain of the transistor N11. The common gates of the transistors P9 and N11 define the input of the inverter 56, which is connected to the output of the inverter 54. The common drains of the transistors P9 and N11 define the output of the inverter 56, which is connected to the first input of the NAND gate 42 via the inverter 40 and to the second input of the NOR gate 44. The source of the transistor N11 is connected to the ground potential node 32. Again, the isolation of the respective power supply and ground potential nodes for the inverters 54 and 56 will prevent noise on the power supply and ground potential nodes 24, 32 from adversely affecting the level of the enable input signal on the terminal 22.

When the enable signal $\overline{EN}$ is at a high or logic "1" level, the first control signal at the output of the NAND gate 42 will be at a high or logic "1" level and the second control signal at the output of the NOR gate 44 will be at a low or logic "0" level. Consequently, both of the transistors P1 and N1 will be turned off. This produces a high impedance tri-state mode at the output terminal pin 18 in which the output buffer circuit 10 is not enabled.

In order to significantly reduce or eliminate the ground bounce when the internal output pin node 26 makes a high-to-low transition, there is provided an edge-rate feedback means which controls the rate of rise of the gate-to-source voltage $V_{GS}$ at the gate of the pull-down transistor N1 so as to slow down its turn-on time. As a result, the rate of change of the output current through the pull-down transistor N1 is limited, thereby reducing significantly the ground bounce. In this preferred embodiment of the invention, the feedback means is comprised of a coupling capacitor C2 for providing feedback of the output voltage at the internal output node 26 directly to the gate of the pull-down transistor N1.

As can be seen, the capacitor C2 is formed of an N-channel MOS transistor N3. The source electrode, drain electrode, and bulk of the transistor N3 are all tied together to form a first plate of the capacitor, and the gate electrode of the transistor N3 forms the second plate of the capacitor. The first plate of the capacitor C2 is joined to the internal output node 26, and the second plate thereof is joined to the gate of the pull-down transistor N1.

In order to provide an understanding of the operation of the present invention, the pull-down action of FIG. 3 will now be explained. Initially, it will be assumed that the enable signal $\overline{EN}$ is at an active low ($\overline{EN}=0$), the data input signal is at the high logic level, and the output signal at the output node 26 is also at the high logic level. Thus, the output of the data input buffer on line 58 will be high and the output of the enable buffer on line 60 will be low. As a result, the first control signal at output of the NAND 42 will be low as to render the pull-up transistor P1 to be conductive, and the second control signal at the output of the NOR gate 44 will be low so as to turn-off the pull-down transistor N1.

When the data input signal DATA makes a high-to-low transition, this will cause the first control signal on line 62 to go high so as to quickly turn off the pull-up transistor P1. Simultaneously, the second control signal on line 64 will begin to go high so as to turn on the pull-down transistor N1. In slow process corners, there will be very little feedback through the capacitor C2 and the pull-down transistor N1 will be turned on slowly with a low rate of change in the output current, which does not create a ground bounce problem. However, in fast process corners, the rate of change of the output voltage at the output node 26 is limited by the capacitor C2 since its voltage thereacross cannot be changed instantaneously. Therefore, if the rate-of-fall of the output voltage is too fast, the temporary and residual low voltage state on the terminal output node 26 acting through the feedback capacitor C2 will turn off the pull-down transistor N1, thereby preventing a high rate of change in the output current flowing therethrough. In this manner, the rate of change of this output current is substantially reduced and thus decreasing significantly the ground bounce.

It should be apparent to those skilled in the art that the capacitor C1 can be similarly provided in connection with the pull-up transistor P1 in order to suppress power supply line voltage spikes when the output node 26 is making a low-to-high transition. Accordingly, it is believed that the pull-up operation of the output circuit 10 is quite apparent in view of the foregoing discussion with respect to the pull-down action and thus will not be explicitly described.

Figure 4:
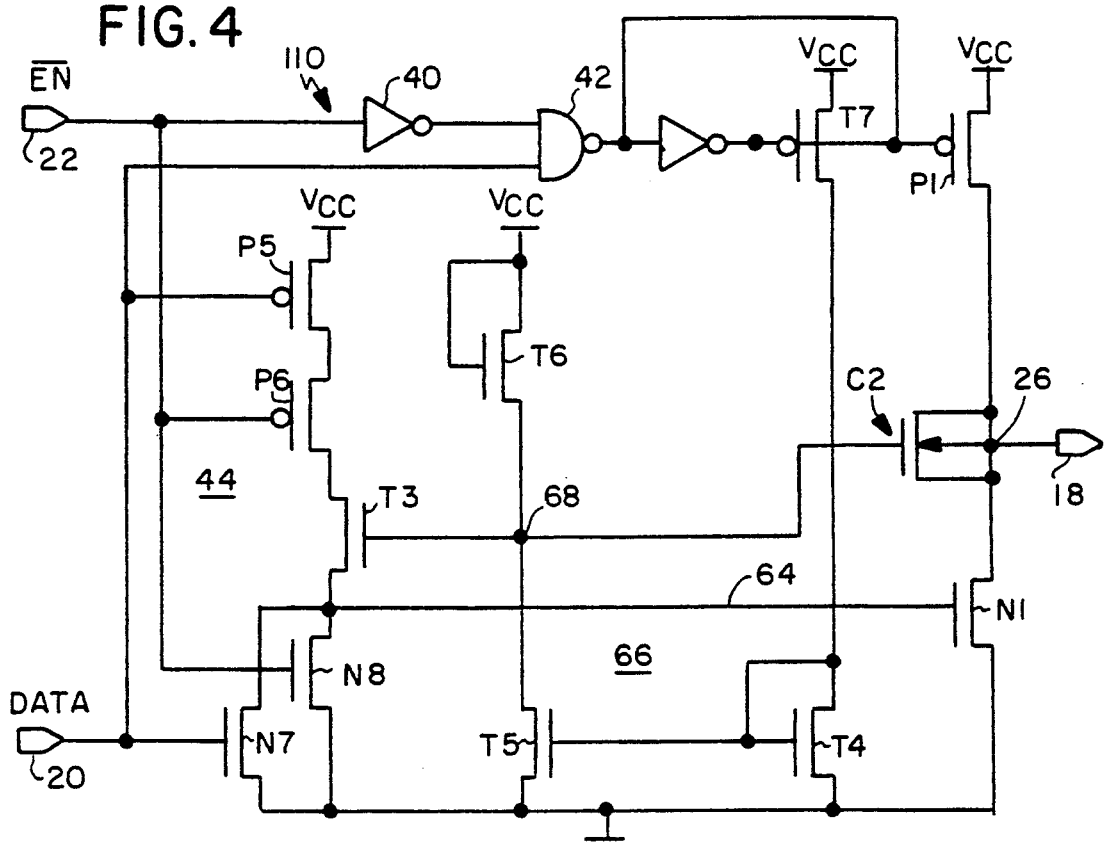
FIG. 4 is a schematic circuit diagram of a second embodiment of the present invention.

In FIGS. 4 through 7, there are shown schematic circuit diagrams illustrating alternate second through fifth embodiments of the output buffer circuit 10 of FIG. 3. The output buffer circuit 110 of FIG. 4 is a second embodiment which is quite similar to buffer circuit 10 of FIG. 3, except that the output voltage at the internal output node 26 acting through the feedback of capacitor C2 is not coupled directly to the gate of the pull-down transistor N1 but is rather coupled to an isolation transistor T3 for interrupting the second control signal on the lines 64 from the NOR gate 44, which is at a high logic level, from being applied to the gate of the pull-down transistor N1. In fast process corners, when the pull-down action occurs, the temporary and residual low voltage state on the internal output node 26 will be acting through the capacitor C2 so as to turn off the isolation transistor T3. As a result, the pull-down transistor N1 will be turned off so as to limit the output current flowing therethrough.

In order to turn back on the transistor T3, there is provided a current mirror arrangement 66 formed of P-channel MOS transistors T6, T7 and N-channel MOS transistors T4, T5. The transistor T7 will be rendered conductive to supply current only when the data input signal is at the low logic level. This will cause the current in the current mirror transistor T4 to be reflected into the current mirror transistor T5. When the voltage at the node 68 reaches the threshold level, the transistor T3 will again be turned on. This, in turn, causes the second control signal on the line 64 to be applied back to the gate of the pull-down transistor N1.

Figure 5:
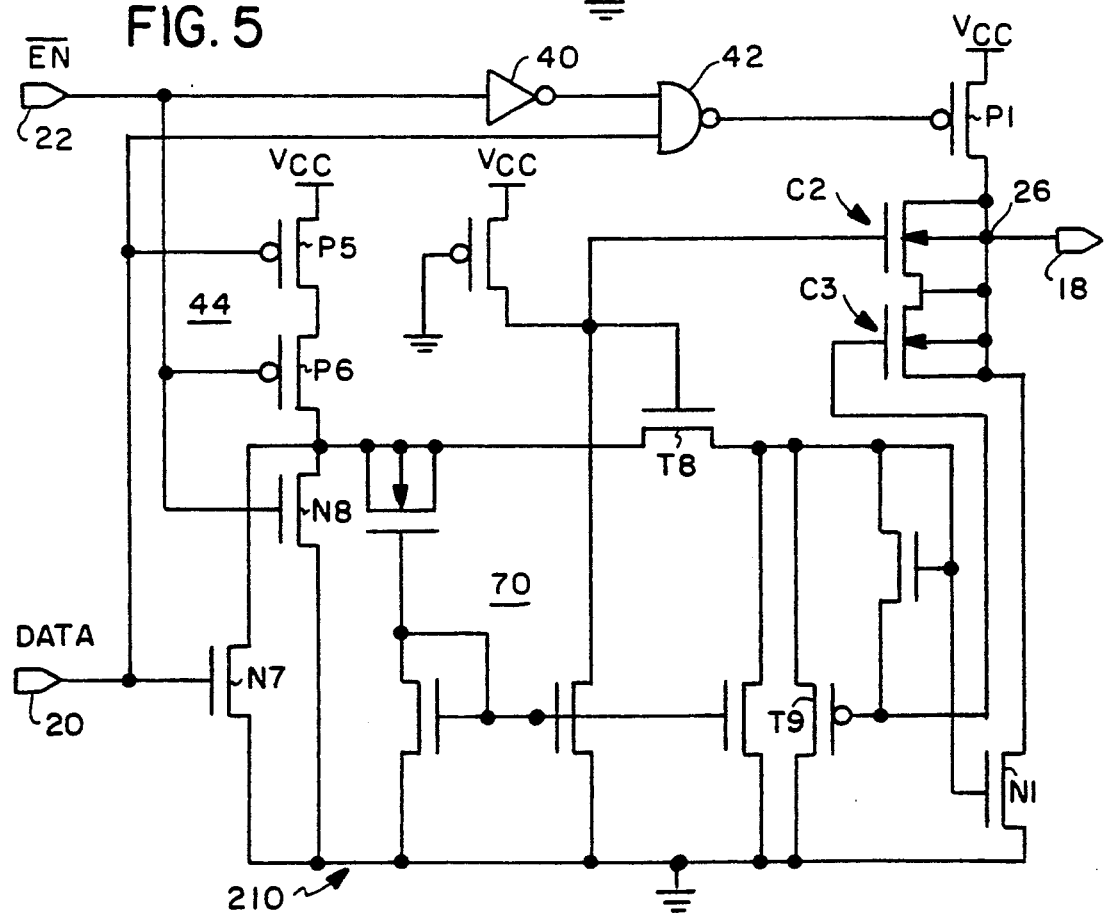
FIG. 5 is a schematic circuit diagram of a third embodiment of the present invention.

The output buffer circuit 210 of FIG. 5 is a third embodiment and is somewhat similar to the buffer circuit 110 of FIG. 4, except that the isolation transistor T3 is replaced with a pass transistor T8 interconnected between the output of the NOR logic gate 44 and the gate of the pull-down transistor N1. In fast process corners, when the pull-down action occurs, the temporary and residual low voltage state on the internal output node 26 will be acting through the coupling capacitor C2 so as to turn off the pass transistor T8. Consequently, pull-down transistor N1 will be turned off so as to limit the output current flowing therethrough.

In order to facilitate the quick turn-off of the pull-down transistor N1, there is also provided a capacitor C3 and a turn-off transistor T9. The temporary and residual low voltage state on the output node 26 will also be acting through the coupling capacitor C3 so as to turn on the transistor T9 which removes the gate drive to the pull-down transistor N1. Further, a current mirror arrangement 70 is used to facilitate the quick discharging of the voltage due to the gate capacitance of the pass transistor T8.

Figure 6:
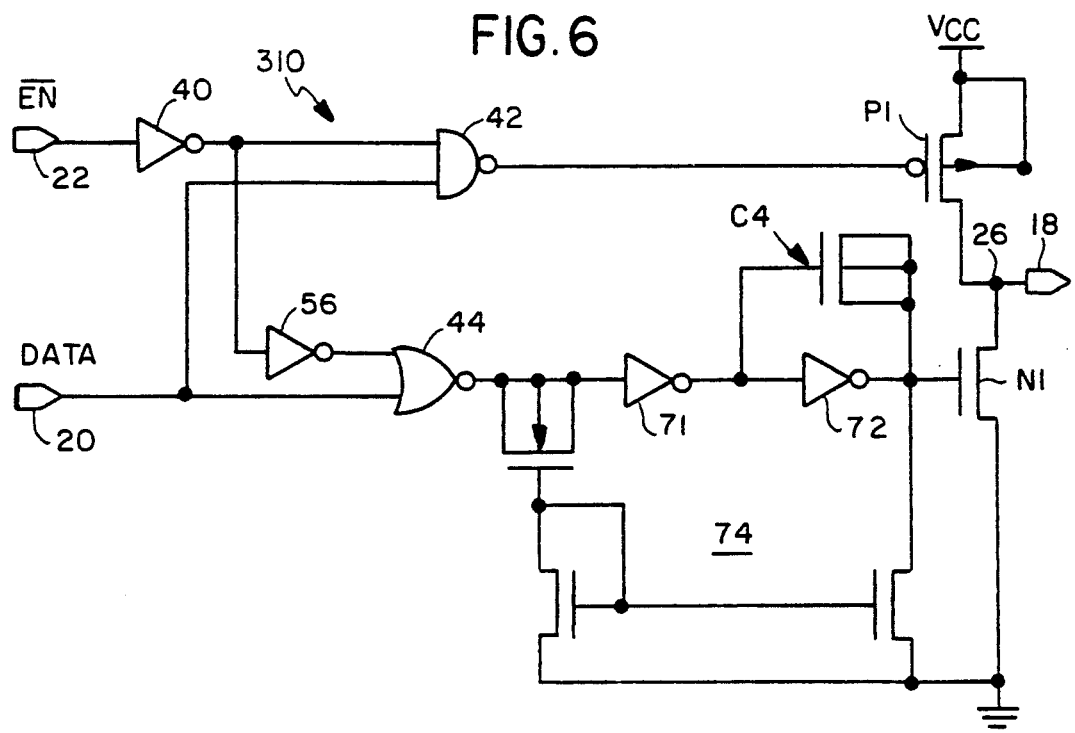
FIG. 6 is a schematic circuit diagram of a fourth embodiment of the present invention.

The output buffer circuit 310 in FIG. 6 is a fourth embodiment and includes two series-connected inverters 71 and 72 interconnected between the output of the NOR gate 44 and the gate of the pull-down transistor N1. A feedback capacitor C4 is connected between the gate of the pull-down transistor N1 and the input of the second inverter 72. The capacitor C4 is used to sense the voltage at an earlier node than in the previous embodiments. If the gate-to-source voltage on the gate of the pull-down transistor N1 rises too rapidly, this gate voltage is fed back via the capacitor C4 to the input of the inverter 72. As a result, the output of the inverter 72 will be changed back to a low voltage state so as to turn back off the pull-down transistor N1, thereby limiting the output current flowing therethrough. Further, a current mirror arrangement 74 is provided so as to facilitate the turning off of the pull-down transistor N1. It should be noted that the control signal for the current mirror arrangement 74 is obtained from yet another earlier node.

Figure 7:
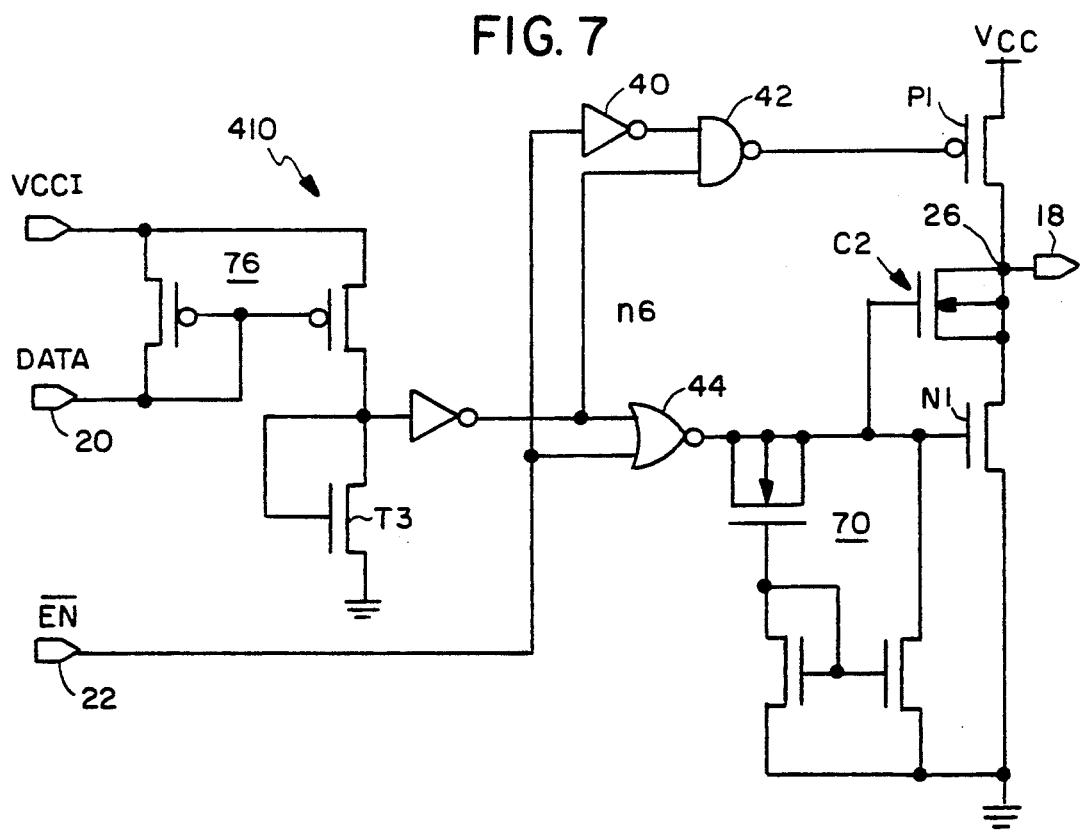
FIG. 7 is a schematic circuit diagram of a fifth embodiment of the present invention.

The output buffer circuit 410 of FIG. 7 is a fifth embodiment similar to the buffer circuits of FIGS. 3 and 5, except that it further includes a current-to-voltage converter 76 in order to maximize the noise margin when the data input signal is referenced to different power supply and ground rails. It will be noted that the output buffer circuit 410 includes a feedback capacitor C2 as shown in FIG. 3 and a current mirror arrangement 70 similar to FIG. 5.

From the foregoing detailed description, it can thus be seen that the present invention provides an edge-rate feedback CMOS output buffer circuit which has a significant reduction in ground bounce. The edge-rate feedback CMOS output buffer circuit of the present invention includes an output driver stage, a pull-up pre-driver circuit, a pull-down pre-driver circuit, and feedback means for controlling the rate of rise of the gate-to-source voltages at the gates of pull-up and pull-down transistors in the output driver stage.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A CMOS output buffer circuit for providing an output signal at an output terminal which has a significant reduction in ground bounce over processing and power supply variations, comprising:

output driver stage means (12) formed of a pull-up transistor (P1) and a pull-down transistor (N1), said pull-up transistor (P1) having one of its main electrodes connected to a power supply potential node and its other one of its main electrodes connected to the output terminal, said pull-down transistor (N1) having one of its main electrodes connected to the output terminal and its other one of its main electrodes connected to ground potential node;

said pull-up transistor (P1) having its gate electrode connected to receive a first control signal for generating a transition from a low logic level to a high logic level at the output terminal;

said pull-down transistor (N1) having its gate electrode connected to receive a second control signal for generating a transition from the high logic level to the low logic level at the output terminal;

pull-up pre-driver means (14) formed of an inverter (40) and a NAND logic gate (42) and being responsive to a data input signal and an enable signal for generating said first control signal;

said inverter (40) having its input coupled to receive the enable signal and its output connected to a first input of said NAND gate (42), said NAND gate (42) having a second input coupled to receive the data input signal and its output connected to the gate electrode of said pull-up transistor (N1);

pull-down pre-driver means (16) formed of a NOR logic gate (44) and being responsive to the data input signal and the enable signal for generating said second control signal;

said NOR gate (44) having a first input coupled to receive the data input signal, a second input connected to receive the enable signal, and an output coupled to the gate electrode of said pull-down transistor (N1);

first feedback means responsive to the output signal for controlling the rate of rise of the voltage at the gate electrode of said pull-down transistor (N1) so as to slow down its turn-on time when the output terminal is making the high-to-low transition thereby significantly reducing the ground bounce;

said first feedback means including a capacitor (C2) having a first plate connected to the output terminal and a second plate coupled to the gate electrode of said pull-down transistor (N1), said capacitor (C2) being formed of an N-channel MOS transistor (N3) having its drain and source electrodes connected together to define the first plate and its gate electrode defining the second plate; and said first feedback means further including transistor means (T3) interconnected between the output of said NOR gate (44) and the gate electrode of said pull-down transistor (N1) and being responsive to the output signal for interrupting said second control signal.

2. A CMOS output buffer circuit as claimed in claim 1, wherein said pull-up transistor (P1) is a P-channel MOS transistor.

3. A CMOS output buffer circuit as claimed in claim 2, wherein said pull-down transistor (N1) is an N-channel MOS transistor.

4. A CMOS output buffer circuit as claimed in claim 1, further comprising second feedback means responsive to the output signal for controlling the rate of rise of the voltage at the gate electrode of said pull-up transistor (P1) so as to slow down its turn-on time when the output terminal is making the low-to-high transition so as to suppress the power supply line voltage spikes.

5. A CMOS output buffer circuit as claimed in claim 4, wherein said second feedback means is comprised of a capacitor (C1) having a first plate connected to the output terminal and a second plate coupled to the gate electrode of said pull-up transistor (P1).

6. A CMOS output buffer circuit as claimed in claim 5, wherein said capacitor (C1) is comprised of an N-channel MOS transistor (N2) having its drain and source electrodes connected together to define the first plate and its gate electrode defining the second plate.

7. A CMOS output buffer circuit for providing an output signal at an output terminal which has a significant reduction in ground bounce over processing and power supply variations, comprising:

pull-up transistor means (P1) responsive to a first control signal for generating a transition from a low logical level to a high logic level at the output terminal;

pull-up pre-driver means (14) being responsive to a data input signal and an enable signal for generating said first control signal;

pull-down transistor means (N1) being responsive to a second control signal for generating a transition from the high logic level to the low logic level at the output terminal;

pull-down pre-driver means (16) being responsive to the data input signal and the enable signal for generating said second control signal;

feedback means responsive to a voltage representative of the output signal for controlling the rate of rise of said second control signal so as to slow down the turn-on time of said pull-down transistor means when the output terminal is making the high-to-low transition thereby significantly reducing the ground bounce; and said feedback means including a first inverter (71), a second inverter (72) and a capacitor (C4), said first inverter (71) having its input being responsive to the second control signal and its output connected to the input of said second inverter (72), said second inverter (72) having its output connected to the gate electrode of said pull-down transistor (N1), said capacitor (C4) having a first plate connected to the input of said second inverter (72) and a second plate connected to the gate electrode of said pull-down transistor (N1).

* * * * *